United States Patent [19]
Pichler

[11] Patent Number: 5,929,562
[45] Date of Patent: Jul. 27, 1999

[54] ORGANIC LIGHT-EMITTING DEVICES

[75] Inventor: Karl Pichler, Cambridge, United Kingdom

[73] Assignee: Cambridge Display Technology Limited, Cambridge, United Kingdom

[21] Appl. No.: 08/945,570

[22] PCT Filed: Apr. 18, 1996

[86] PCT No.: PCT/GB96/00929

§ 371 Date: Feb. 17, 1998

§ 102(e) Date: Feb. 17, 1998

[87] PCT Pub. No.: WO96/33516

PCT Pub. Date: Oct. 24, 1996

[30] Foreign Application Priority Data

Apr. 18, 1995 [GB] United Kingdom .................. 9507862

[51] Int. Cl.⁶ .................................................. H05B 33/14
[52] U.S. Cl. ......................... 313/506; 313/509; 313/512; 313/1; 428/917; 445/24
[58] Field of Search .................................. 313/506, 509, 313/510, 512, 1; 315/169.3; 428/690, 917; 445/24

[56] References Cited

U.S. PATENT DOCUMENTS

| | | | |
|---|---|---|---|
| 3,089,973 | 5/1963 | Herold et al. | 313/1 |
| 4,945,009 | 7/1990 | Taguchi et al. | 313/509 X |
| 5,053,679 | 10/1991 | Thioulouse | 313/512 X |
| 5,247,190 | 9/1993 | Friend et al. | |
| 5,425,125 | 6/1995 | Holmes et al. | |
| 5,469,019 | 11/1995 | Mori | 313/512 X |
| 5,485,355 | 1/1996 | Voskoboinik et al. | 313/512 X |

FOREIGN PATENT DOCUMENTS

| | | |
|---|---|---|
| 2629356 | 5/1978 | Germany . |
| 9506400 | 2/1995 | WIPO . |

OTHER PUBLICATIONS

C.W. Tank et al., "Electroluminescence of Doped Organic Films", J. Appl. Phys., 65(9), May 1, 1989; pp. 3610–3616.

R.H. Leach, "The Printing Ink Manual", published by Van Nostrand Reinhold, pp. 394–397, Dec. 1988.

F. Shepherd, "Modern Coating Technology Systems—for Paper, Film and Foil", published by Emap Maclaren Ltd., UK, pp. 58–60, Dec. 1995.

*Primary Examiner*—Ashok Patel
*Attorney, Agent, or Firm*—Merchant, Gould, Smith, Edell, Welter & Schmidt

[57] ABSTRACT

A method of fabricating an organic electroluminescent display, which includes laminating together a plurality of self-supporting organic light-emitting devices, each of which is capable of functioning separately as an individual device; wherein each of the organic light-emitting devices in the display emits radiation differently from one another in respect of color, pattern and/or direction; and wherein each of the organic light-emitting devices in the display includes a substrate, a first electrode and a second electrode, at least one of which electrodes is at least semi-transparent, and an organic electroluminescent layer between the electrodes.

31 Claims, 2 Drawing Sheets

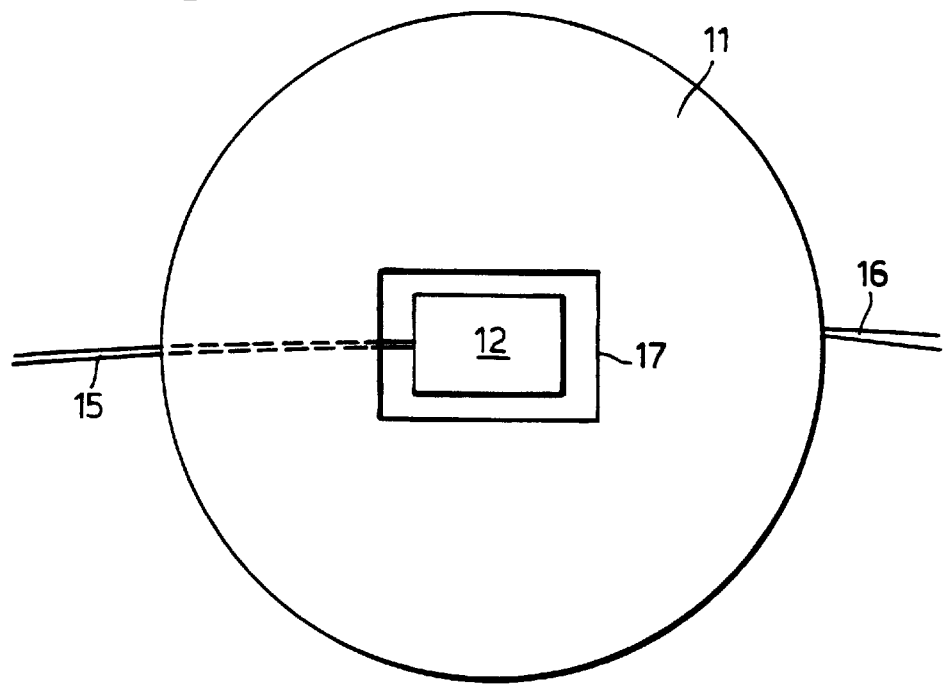

ORGANIC LIGHT-EMITTING DEVICES

FIELD OF THE INVENTION

The present invention relates to composite organic light-emitting devices and their fabrication.

BACKGROUND TO THE INVENTION

Polymer organic electroluminescent devices such as described in U.S. Pat. No. 5,247,190 and molecular organic electroluminescent devices as described by C. W. Tang, S. A. Van Slyke and C. H. Chen in J Appl. Phys. 65, 3610 (1989) have been demonstrated with emission bands in all parts of the visible spectrum. Therefore this technology is amenable for use in multi-colour or true RGB emissive displays and these can be simple uniform lights, alphanumeric and dot-matrix displays or high-resolution displays. In order to achieve the desired multi-colour effect, pixels with different emission bands have to be processed/manufactured on a substrate next to each other. This requires patterning steps which can be very difficult to implement, even on a laboratory scale; the organic layers may not be compatible with the patterning processes and/or cross-talk between adjacent devices of different colours may occur. The devices emitting different colours can also be processed on top of each other with the higher energy light emission organic layers in front followed by the layers responsible for the lower energy light emission. Again, patterning and cross-talk issues are very important here and can add significantly to the device and manufacturing complexity. The same issues are relevant in devices in which various degrees of patterning complexities are required, such as in a combination of a uniform emissive area with a higher information content display.

If such organic light-emitting devices with multi-colour emission and/or different patterning complexity are fabricated on one substrate where the active emissive organic layers, electrodes, and additional layers are sequentially deposited, then all processing steps (deposition of the organic electroluminescent layers, transport layers, electrodes, patterning, etc.) for all pixels and patterns of all employed colours and shapes have to be free of crucial defects and the yield for each processing step has to be high in order to result in an acceptable and economically viable total production yield and cost for the final display. Also, each change in one or more of the features of the final display, for example changing one of the emission colours or patterns in a display, may require a costly and significant if not complete re-design of the manufacturing process. The processes of making electrical contacts, testing, yield control, etc. can be very critical and complicated in a more complex display. Furthermore, individual processing steps, for example a heat treatment for one of the organic layers, may only be poorly or even not at all compatible with materials and/or structures already on the substrate or the substrate itself.

The invention describes organic light-emitting devices which have one or more emission colours and/or one or more emission patterns and/or emission directions and describes a general and versatile method for the fabrication of such devices which avoids the problems described above and has further significant advantages which manufacturing methods have hitherto been unable to exploit.

SUMMARY OF THE INVENTION

According to a first aspect of the invention there is provided a method of fabricating an organic electroluminescent display, which comprises laminating together a plurality of self-supporting organic light-emitting devices, each of which is capable of functioning separately as an individual device; wherein each of the organic light-emitting devices in the display emits radiation differently from one another in respect of colour, pattern and/or direction; and wherein each of the organic light-emitting devices in the display comprises a substrate, a first electrode and a second electrode, at least one of which electrodes is at least semi-transparent, and an organic electroluminescent layer between the electrodes.

The organic electroluminescent layer may comprise a conjugated polymer capable of electroluminescence. Examples of such conjugated polymers are described in U.S. Pat. No. 5,247,190. These polymers include poly(arylene vinylene) polymers such as poly(paraphenylene vinylene) (PPV). Further examples of suitable poly(arylene vinylene) polymers are described in U.S. Pat. No. 5,425,125. The organic electroluminescent layer may comprise an emissive layer and at least one charge carrier injection and/or transport layer.

This aspect of the invention of using lamination techniques makes specific use of the fact that organic light-emitting devices can be made very thin. The thickness of each device is typically in the range 25 $\mu$m to 2 mm, for example from >25 $\mu$m to about 1 mm. In particular, the devices can be fabricated using flexible substrates, such as polyester, polyimide or thin flexible glass, as well as rigid materials or a combination of flexible and rigid materials.

The plurality of self-supporting organic light-emitting devices may comprise at least a first organic light-emitting device and a second light-emitting device in which a window is provided in the plane of the at least first organic light-emitting device so that radiation from the second light-emitting device will reach a viewer through the window. The window may be formed as a region of partial or high transparency in at least the first organic light-emitting device and preferably comprises a non-emissive window. The first organic light-emitting device may comprise two at least partially transparent electrodes and an emissive layer having a bandgap energy greater than the energy of the light emitted from the second light-emitting device.

In a further aspect of the invention, the organic electroluminescent display is provided with one or more layers of additional functionality which are selected from colour filters, insulation layers, layers of refractive index suitable for reduction of internal reflection, encapsulation layers, diffusion layers, oxygen barriers and moisture barriers. The selection of such layers will depend upon the use to which the display is to be put.

In a further aspect, at least one of the organic light-emitting devices comprise a backlight which may be formed from red, green and blue light-emitting devices which are capable of providing alternate red, green and blue emissions. In a further aspect, each organic light-emitting device has a different emission colour and an electrode pattern arranged so as to produce pixels in the display.

In one method of manufacture, a plurality of composite displays is fabricated in a single laminate and individual composite displays are excised from the laminate.

According to a further aspect of the invention there is provided a composite organic electroluminescent display, which comprises a laminate of a plurality of self-supporting organic light-emitting devices, each of which is capable of functioning separately as an individual device; wherein each of the organic light-emitting devices in the display emits radiation differently from one another in respect of colour, pattern and/or direction; and wherein each of the organic light-emitting devices in the display comprises a substrate, a first electrode and a second electrode, at least one of which electrodes is at least semi-transparent, and an organic electroluminescent layer between the electrodes.

According to a further aspect of the invention there is provided a method of fabrication of multi-colour and/or multi-pattern organic electroluminescent displays by laminating together at least two individual self-supporting organic light-emitting devices as defined above in the first aspect of the invention and in which one or more additional layers which are not themselves organic light-emitting devices but have additional functionality are introduced into the composite display either between the light-emitting devices or at the outer side(s) of the composite display or both before or during the process of lamination of the composite display. These layers of additional functionality include but are not limited to colour filters, encapsulation layers and diffusion barriers, oxygen or moisture absorbers, layers of specifically chosen refractive index, insulating layers, etc.

According to a further aspect of the invention there is provided a novel organic light-emitting composite display which is fabricated by way of lamination and which is comprised of at least two self-supporting organic light-emitting devices according to any one of the above aspects of the invention.

BRIEF DESCRIPTION OF THE DRAWINGS

The invention will now be described in further detail, by way of example only, with reference to the accompanying drawings.

FIG. 1 shows a schematic diagram of a device in accordance with one embodiment of the invention;

FIG. 2a and FIG. 2b show a side view and top view respectively of a device according to a second embodiment of the invention;

DESCRIPTION OF THE PREFERRED EMBODIMENTS

Figure 3A:
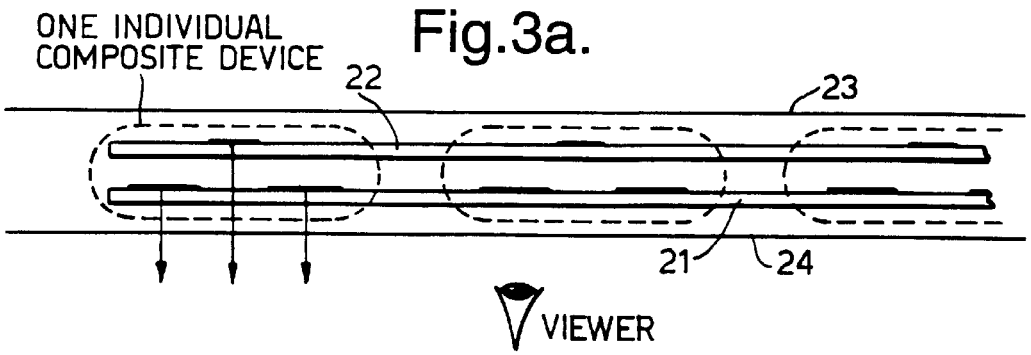
FIG. 3a and FIG. 3b show respectively a side view and top view of a plurality of composite displays according to the present invention.
Figure 3B:
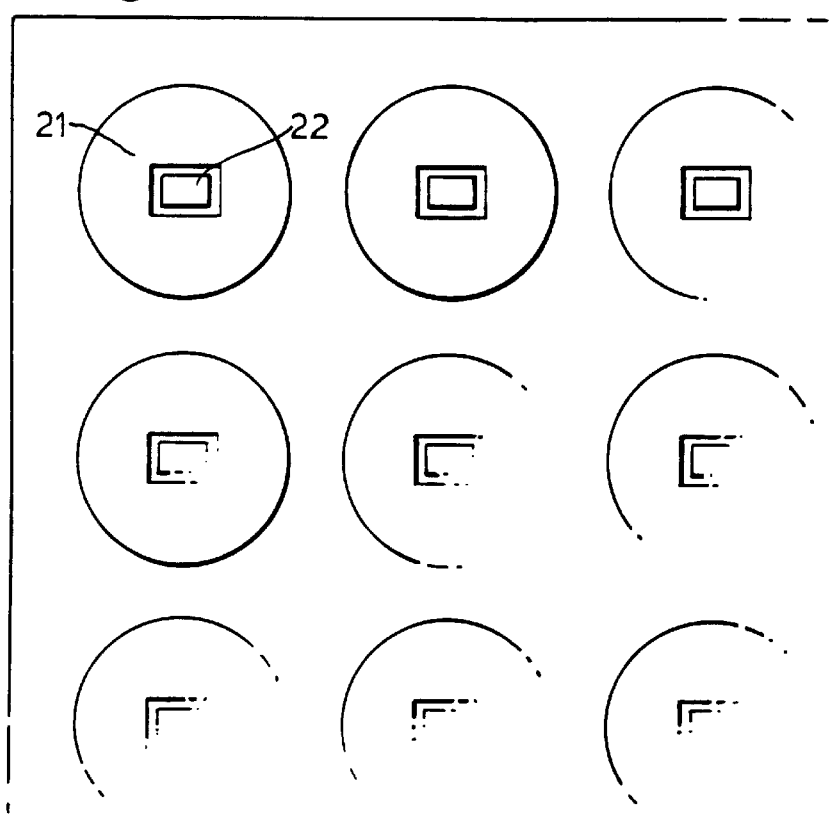

The invention is used to provide an easy and very versatile method of fabricating composite organic light-emitting displays with either more emission colours or more emission patterns or different emission directions or any combination of the three by laminating together at least two in themselves functional organic electroluminescent devices; the laminate may also include layers of other functionality. Each of the individual organic light-emitting devices used in the lamination process is comprised of a substrate, a first and a second electrode, at least one of which is at least semi-transparent, and one or more layers between the first and second electrode which act as charge carrier injection and/or transport layers and/or emissive layers whereby at least one of these layers between the first and second electrode is an organic electroluminescent layer which is preferably but not necessarily a conjugated polymer.

The process of lamination can be of any suitable form such as a batch process in a press which may or may not be flat and may or may not be heated or it may be a batch or continuous lamination process using rollers; it may be a dry lamination process using, for example, heat, a wet lamination process using waxes or adhesives, an extrusion process, or indeed any other approved way of lamination which is compatible with all layers fed into the laminate; for example, adhesives which may be used to hold the laminate together, must be at least partly transparent to the emitted light. Some examples of lamination techniques are given in 'The Printing Ink Manual' ed by R. H. Leach, published Van Nostrand Reinhold, 1988, pp 394–397 or in 'Modern Coating Technology Systems—for Paper, Film and Foil' by F. Shepherd, published by Emap Maclaren Ltd, UK, 1995.

The substrates or additional functional layers in the laminate used for the individual organic light-emitting devices can be of any suitable material, such as rigid or flexible glass, plastic, metal or other materials.

The invention allows for the fabrication of composite organic light-emitting devices which are composed of individual organic light-emitting devices with or without additional layers of additional functionality in the composite display, in which the fabrication process of individual layers is not compatible with that of others. Furthermore, the invention allows the fabrication of a wide range of composite displays (colours, shapes, patterns, sizes, etc.) in a very flexible and cost-effective way due to the ability of combining elements from a multitude of individual organic light-emitting devices at a very late stage of the manufacturing process. In one embodiment of the invention the light-emitting laminate is constructed such that the emission from the device(s) which emit lower-energy light passes, at least in part, through light-emitting areas of the higher-energy light emitting devices; in this case the lower-energy light-emitting device would be behind the higher-energy light-emitting device as seen by the viewer. An example of this embodiment is given in FIG. 1 which shows a laminate consisting of a red emitting device 2 and a green emitting device 1 which partly overlap. Each device comprises a substrate, anode and cathode with connector leads 5, 6 and an organic layer system between the anode and the cathode from which light is emitted. FIG. 1 also shows the electrical contacts to the devices 1 and 2. The green emitting device 1 is in front and must be at least partly transparent to the red light; this is achieved by making both electrodes of the green device at least partially transparent. Over the area where both devices do not overlap the laminate emits red or green and over the area where the devices do overlap one sees either red or green, depending on which device is on, or a mixture of both colours if both devices are on at the same time. Cover layers 3 and 4 in FIG. 1 are at the outer sides of the laminate and are, for example, mechanically protecting plastic sheets which hold the laminate together. Layer 3 must be at least partly transparent to the light emitted from the devices. The cover layers can have other functionality such as having colour filter properties and/or being a moisture and/or oxygen barrier. The devices and/or the inner sides of the cover layers 3 and 4 in FIG. 1 would normally be coated, before or during the lamination process, with adhesives or waxes which make the laminate stick together (not shown in FIG. 1). Alternatively, this could be achieved by feeding a melt processible plastic into the laminate and using a heating step in the lamination process in order to glue the laminate together.

In a specific embodiment of the invention a composite display in which sheets of a red, a green and a blue-emitting organic light-emitting device, with either uniform or patterned emission, are laminated together is used as a backlight in a full colour liquid crystal display; such a composite back light emitting alternately red, green and blue light would have the particular advantage of improved efficiency of the liquid crystal display due to the reduction of loss of light in the absorption filters, or indeed the partial or complete elimination of the need for the absorption filters normally used in colour liquid crystal displays. The degree to which the absorption filters in the liquid crystal displays can be eliminated or loss be reduced will depend much on the narrowness of the emission bands from the laminated organic light-emitting device. Thus a low cost monochrome liquid crystal display can be used in combination with a laminated backlight. The red, green and blue backlights are addressed sequentially in any order to provide alternate red, green and blue images, that make up the full-colour image. For operation of the display at video rate, each frame of the monochrome display as well as the individual backlight layers need to be addressed at three times the video rate. In general, therefore, thin and light-weight organic light-emitting displays such as for example described in this invention can be used to advantage as backlights in liquid crystal displays.

In another embodiment of the invention the light-emitting laminate is constructed such that the devices which are in front, as seen by the viewer, contain parts of high transparency which are not part of their emitting area, for example which do not have electrodes or organic light-emitting and/or charge transporting layers or neither, in order to create windows of high transparency for the emission from other devices further behind. An example of such laminate is given in the FIGS. 2a (side view) and 2b (front view). The layers 13 and 14 are again the cover layers of the laminate which contains two devices 11 and 12 with the electrical contacts 15, 16 shown. As the FIGS. 2a and 2b show, by example only, device 11 may be a uniformly emitting light whereas device 12 may be an alpha-numeric display. In the FIGS. 2a and 2b device 11 is circular with a central rectangular transmission window 17 into which device 12 is positioned/laminated. The transmission window in device 11 permits the viewer to see emission from device 12. There would normally also be an insulating layer between the devices 11 and 12, for example in order to prevent electrical contact of the connector leads of device 12 with the active area of device 11 (not shown in the FIGS. 2a and 2b). Multiple leads 15 contact the pixels in device 12.

The FIGS. 2a and 2b also show that the individual devices in the laminate do not need to be of the same size.

In a specific embodiment of the invention various devices within the laminate emit in different directions, i.e. light is emitted out of the laminate in more than one plane of the laminate. Referring to FIG. 1, this could simply be achieved by turning one of the two devices in FIG. 1 around such that emission also occurs through cover layer 4. If both electrodes of one or more of the light-emitting devices in the laminate are at least semi-transparent, then emission in both directions will occur naturally.

In a preferred embodiment of the invention the individual organic light-emitting devices within the laminate are electrically insulated from each other in order to avoid, for example, electrical interference and leakage currents. This may be achieved by feeding either electrically insulated light-emitting devices into the laminate or by introduction of insulating layers during the lamination process. The electrical insulation referred to in this embodiment also relates to the wires used to contact the devices in the laminate.

In one embodiment of the invention the individual organic light-emitting devices are all rigid, in another embodiment they are all flexible and in another embodiment they are a combination of both.

In one embodiment of the invention at least one of the light-emitting devices in the laminate is a flexible device which is fabricated on a flexible substrate, such as polyester, flexible glass or a metal foil.

In a specific embodiment of the invention the lamination process is used to encapsulate the organic light-emitting devices with moisture, diffusion and/or oxygen barriers or the devices can already be encapsulated before they are fed into the laminate. Layers of other functionality may also be incorporated in the laminate.

In a specific embodiment of the invention and taking FIG. 1 as example, a plastic layer with a refractive index in between that of the substrate of device 1 and that of the cover layer 3 in FIG. 1 could be incorporated in between device 1 and the cover layer 3 in FIG. 1 in order to improve output coupling of light from device 1 by reduction of internal reflections. Alternatively, for example, a diffuser layer may be laminated on the outer side of the laminate onto the cover layer 3 in FIG. 1, also in order to improve output coupling of light.

In another specific embodiment, absorption filters are incorporated into the laminate in order to spectrally narrow the emission band from the light-emitting devices or to protect the devices from ambient light in order to minimise the creation of excited states in the organic layer due to external light, this also has advantageous contrast-enhancing effects by reducing reflection and photoluminescence. Such an absorption layer would, taking FIG. 2a as an example, be incorporated into the laminate between the devices 11 and 12 and the viewer, either inside or outside the cover layer 14.

In one embodiment of the invention, electrical contacts to one, some or all of the individual devices are made before or after the lamination of the composite display; in another embodiment the contacting is done during the lamination process; another embodiment comprises a combination of the former two.

In another embodiment of the invention the lamination is performed with a plurality of composite displays in the laminate and the individual composite displays are then cut, stamped, sawn, etc. out of the whole laminate. An example of such a process/laminate is given in the FIGS. 3a (side view) and 3b (top view) which is based on the laminate structure of FIG. 2. In this laminate the device 21 consists of a sheet with a multiple of individual uniform round emitting areas with a non-emitting transmission window and another sheet with a multiple of small alpha-numeric displays (device 22) which is laminated together with device 21 and the cover layers 23, 24. Both devices 21 and 22 would already have their electrical connections in place (for example metal tracking on the sheets of the devices); after the lamination process the individual composite displays can be stamped out and the connection to the metal tracking and hence the device is, for example, made by punching through the laminate onto the metal tracking.

Figure 4:
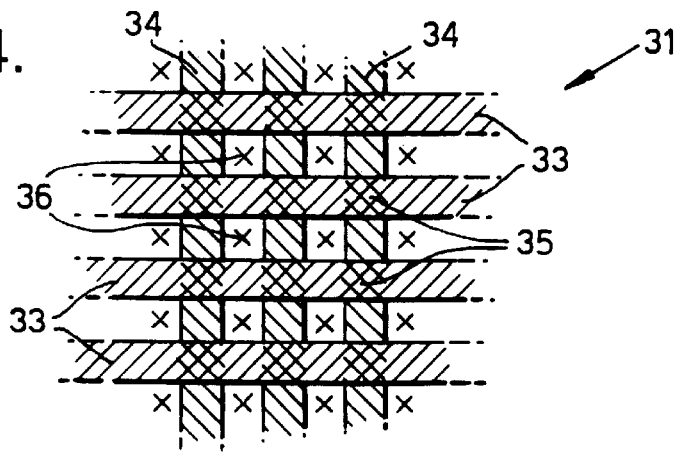
FIG. 4 is a schematic representation of a device according to a further embodiment of the present invention.

In a specific embodiment of the invention each individual organic light-emitting device of the laminate has a different emission colour but all have an electrode pattern which consists of an array of rows and columns to give a matrix of light-emitting pixels; in this specific embodiment the pixels of the different light-emitting devices may or may not overlap but preferably they do not overlap and devices in front have windows of high transmission for light emitted from pixels of the devices which are behind, as seen by the viewer. This specific embodiment provides a way to manufacture multi-colour pixellated dot-matrix/high-resolution graphic displays. FIG. 4 is used to show an example of the basic principle of this embodiment using two light-emitting devices; the embodiment, however, is not limited to the number of devices and geometrical arrangement shown in FIG. 4. The device 31 in FIG. 4 consists of an array of rows on columns with the organic layer system in between them. The rows 33 and columns 34 form the first and second electrodes of the device and the light-emitting pixels 35 of the device 31 are hence the square areas where the rows and columns overlap.

Another light-emitting device of the same pattern but with a different emission colour is laminated together with device 31, the cover layers and possibly other layers such that the emitting pixels 36 of the second device (not shown) lie over the areas of device 31 marked with crosses. This would give a display in which each pixel of the first colour is surrounded by pixels of the second colour, and vice versa.

The present invention describes multi-colour and/or multi-pattern organic light-emitting devices and a very flexible manufacturing process for such organic light-emitting devices by way of laminating together individual self-supporting organic light-emitting devices. Multi-colour and/or multi-pattern displays have a huge range of consumer and industrial applications where the invention can be used to advantage. Such applications are, for example, multi- or full-colour dot-matrix and high resolution displays, light-emitting areas with different emission colours for advertising purposes, displays which combine an alpha-numeric array with a uniformly lit background such as is useful in watches, car dashboards, mobile phones, pagers, instrument displays which combine a high resolution display with a display which shows a low resolution grid such as used in oscilloscopes, logos, etc. Another large area of application where the invention is useful is as thin-film and light-weight backlight for liquid crystal displays and there in particular for full colour liquid crystal displays where the loss in the absorption filters which are normally used can be reduced or preferably the filters can be eliminated by the use of a composite organic light emitting backlight with red, green and blue emission.

I claim:

1. A method of fabricating an organic electroluminescent display, which comprises laminating together a plurality of self-supporting organic light-emitting devices, each of which is capable of functioning separately as an individual device; wherein each of the organic light-emitting devices in the display emits radiation differently from one another selectively in respect of one or more of colour, pattern and direction; and wherein each of the organic light-emitting devices in the display comprises a substrate, a first electrode and a second electrode, at least one of which electrodes is at least semi-transparent, and an organic electroluminescent layer between the electrodes.

2. A method according to claim 1, wherein a window is provided in the plane of at least a first organic light-emitting device so that radiation from a second light-emitting device will reach a viewer through the window.

3. A method according to claim 2, wherein the window is formed as a region of partial or high transparency in at least the first organic light-emitting device.

4. A method according to claim 2, wherein the window comprises a non-emissive window.

5. A method according to claim 3, wherein the first organic light-emitting device comprises two at least partially transparent electrodes and an emissive layer having a bandgap energy greater than the energy of the light emitted from the second light-emitting device.

6. A method according to claim 1, wherein the organic electroluminescent layer comprises a conjugated polymer.

7. A method according to claim 1, wherein the organic electroluminescent layer comprises an emissive layer and at least one of charge carrier injection and transport layer.

8. A method according to claim 1, wherein each substrate comprises a flexible material, a rigid material, or a combination thereof.

9. A method according to claim 1, wherein the thickness of each organic light-emitting device is in the range 25 $\mu$m to 2 mm.

10. A method according to claim 1, wherein one or more layers of additional functionality are provided as an inner layer of the display between the light-emitting devices, or as an outer layer of the display.

11. A method according to claim 10, wherein the one or more layers of additional functionality are selected from colour filters, insulation layers, layers of refractive index suitable for reduction of internal reflection, encapsulation layers, diffusion barriers, oxygen barriers and moisture barriers.

12. A method according to claim 1, wherein at least one of the organic light-emitting devices comprises a backlight.

13. A method according to claim 12, wherein the backlight is formed from red, green and blue light emitting devices which are capable of providing alternate red, green and blue emissions.

14. A method according to claim 1, wherein each organic light-emitting device has a different emission colour and an electrode pattern arranged so as to produce pixels in the display.

15. A method according to claim 1, wherein a plurality of composite displays are fabricated in a single laminate and individual composite displays are excised from the laminate.

16. A composite organic electroluminescent display, which comprises a laminate of a plurality of self-supporting organic light-emitting devices, each of which is capable of functioning separately as an individual device; wherein each of the organic light-emitting devices in the display emits radiation differently from one another selectively in respect of one or more of colour, pattern and direction; and wherein each of the organic light-emitting devices in the display comprises a substrate, a first electrode and a second electrode, at least one of which electrodes is at least semi-transparent, and an organic electroluminescent layer between the electrodes.

17. A composite organic electroluminescent display according to claim 16, wherein a window is provided in the plane of at least a first organic light-emitting device so that radiation from a second light-emitting device will reach a viewer through the window.

18. A composite organic electroluminescent display according to claim 17, wherein the window is formed as a region of partial or high transparency in at least the first organic light-emitting device.

19. A composite organic electroluminescent display according to claim 17, wherein the window comprises a non-emissive window.

20. A composite organic electroluminescent display according to claim 18, wherein the first organic light-emitting device comprises two at least partially transparent electrodes and emits light at a higher energy than the second light-emitting device.

21. A composite organic electroluminescent display according to claims 16, wherein the organic electroluminescent layer comprises a conjugated polymer.

22. A composite organic electroluminescent display according to claim 16, wherein the organic electroluminescent layer comprises an emissive layer and at least one of charge carrier injection and transport layer.

23. A composite organic electroluminescent display according to claim 16, wherein each substrate comprises a flexible material, a rigid material, or a combination thereof.

24. A composite organic electroluminescent display according to claim 16, wherein the thickness of each organic light-emitting device is in the range 25 µm to 2 mm.

25. A composite organic electroluminescent display according to claim 16, wherein one or more layers of additional functionality are provided as an inner layer of the display between the light-emitting devices, or as an outer layer of the display.

26. A composite organic electroluminescent display according to claim 25, wherein the one or more layers of additional functionality are selected from colour filters, insulation layers, layers of refractive index suitable for reduction of internal reflection, encapsulation layers, diffusion barriers, oxygen barriers and moisture barriers.

27. A composite organic electroluminescent display according to claim 16, wherein at least one of the organic light-emitting devices comprises a backlight.

28. A composite organic electroluminescent display according to claim 27, wherein the backlight is formed from red, green and blue light emitting devices which are capable of providing alternate red, green and blue emissions.

29. A composite organic electroluminescent display according to claim 16, wherein each organic light-emitting device has a different emission colour and an electrode pattern arranged so as to produce pixels in the display.

30. A composite organic electroluminescent display according to claim 27, wherein at least one of the organic light-emitting devices forms an alpha-numeric or dot matrix display.

31. A liquid crystal display in which a composite display according to claim 27 is used as a backlight.

* * * * *